(12) United States Patent
Ye et al.

(10) Patent No.: US 8,510,705 B2
(45) Date of Patent: Aug. 13, 2013

(54) COMPUTING DEVICE AND METHOD FOR CHECKING VIA STUB

(75) Inventors: Jia-Lu Ye, Shenzhen (CN); Chia-Nan Pai, New Taipei (TW); Shou-Kuo Hsu, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/327,771

(22) Filed: Dec. 16, 2011

(65) Prior Publication Data

US 2013/0097576 A1    Apr. 18, 2013

(30) Foreign Application Priority Data

Oct. 14, 2011    (CN) .......................... 2011 1 0312725

(51) Int. Cl.
*G06F 17/50*    (2006.01)
(52) U.S. Cl.
USPC ............ 716/136; 716/111; 716/132; 716/139

(58) Field of Classification Search
USPC .................................. 716/111, 132, 136, 139
See application file for complete search history.

(56) References Cited

U.S. PATENT DOCUMENTS

| | | | |
|---|---|---|---|
| 7,917,886 B2* | 3/2011 | Chen et al. .................... | 716/137 |
| 7,979,983 B2* | 7/2011 | Bird et al. ....................... | 29/852 |
| 7,984,420 B2* | 7/2011 | Eldridge et al. .............. | 717/108 |

* cited by examiner

*Primary Examiner* — Thuan Do
(74) *Attorney, Agent, or Firm* — Altis Law Group, Inc.

(57) ABSTRACT

A computer-based method and a computing device for checking stub lengths of via stubs of a printed circuit board (PCB) layout are provided. The computing device displays a check interface, selects signal transmission line from a currently run PCB layout through the check interface, receives a reference stub length input through the check interface, and determines the actual stub length of each via stub of each via each selected signal transmission line connected to. The computing device further determines that a design of one via stub satisfies the design standards, if the actual stub length of the one stub via is less than or equal to the reference length, and determines that a design of one via stub does not satisfy the design standards if the actual stub length of the one via stub is greater than the reference stub length.

8 Claims, 4 Drawing Sheets

COMPUTING DEVICE AND METHOD FOR CHECKING VIA STUB

BACKGROUND

1. Technical Field

Embodiments of the present disclosure relates to circuit simulating systems and methods, and more particularly, to a computing device and a method for checking the stub lengths of via stubs of a printed circuit board (PCB) layout.

2. Description of Related Art

A via stub is a part of a through via and functions as a short transmission line for the high-speed signal, and can be a major factor in whether or not resonance reflection has an impact on signal integrity. The stub length of a via stub can affect signal transmission. Thus, the stub length of a via stub should satisfy a predetermined standard when designing a PCB layout. However, checking the stub lengths of via stubs are often done manually, which is not only time-consuming, but also error-prone.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
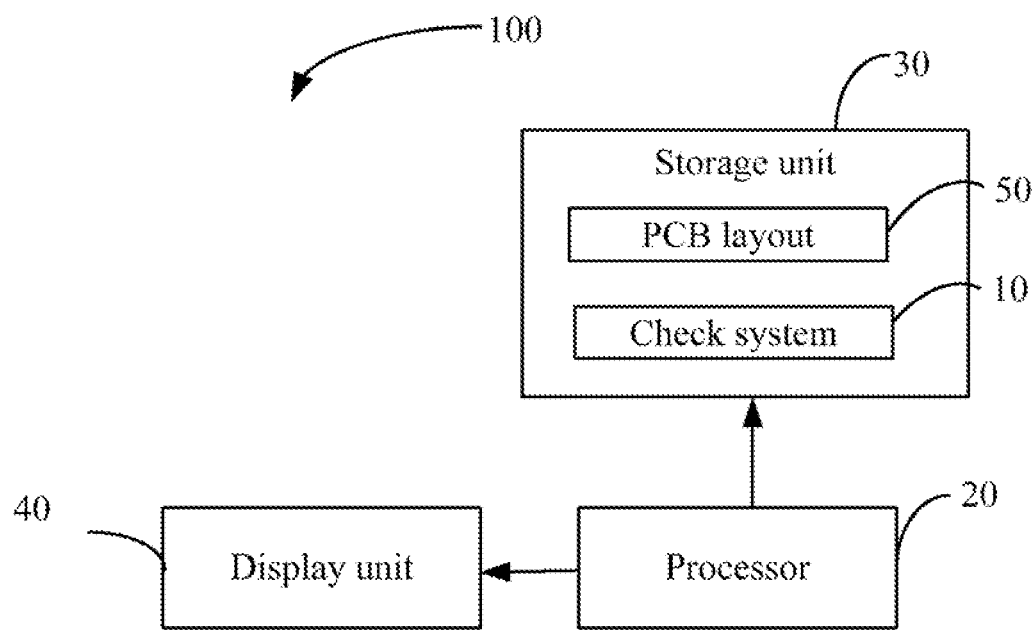
FIG. 1 is a block diagram of one embodiment of a computing device for checking the stub lengths of via stubs of a PCB layout.

FIG. 1 is a block diagram of one embodiment of a computing device 10. The computing device 10 includes a processor 20, a storage unit 30, and a display unit 40. The storage unit 30 may be a computer, a smart media card, a secure digital card, or a flash card. The storage unit 30 stores computerized codes of a check system 10, at least one PCB layout 50, and each information file corresponding to each PCB layout 50. Each information file includes parameters for determining stub lengths of via stubs of each PCB layout 50. The check system 10 includes various software components and/or set of instructions, which may be implemented by the processor 14 to check whether the actual stub lengths of via stubs of each PCB layout 50 satisfy design standards.

Figure 2:
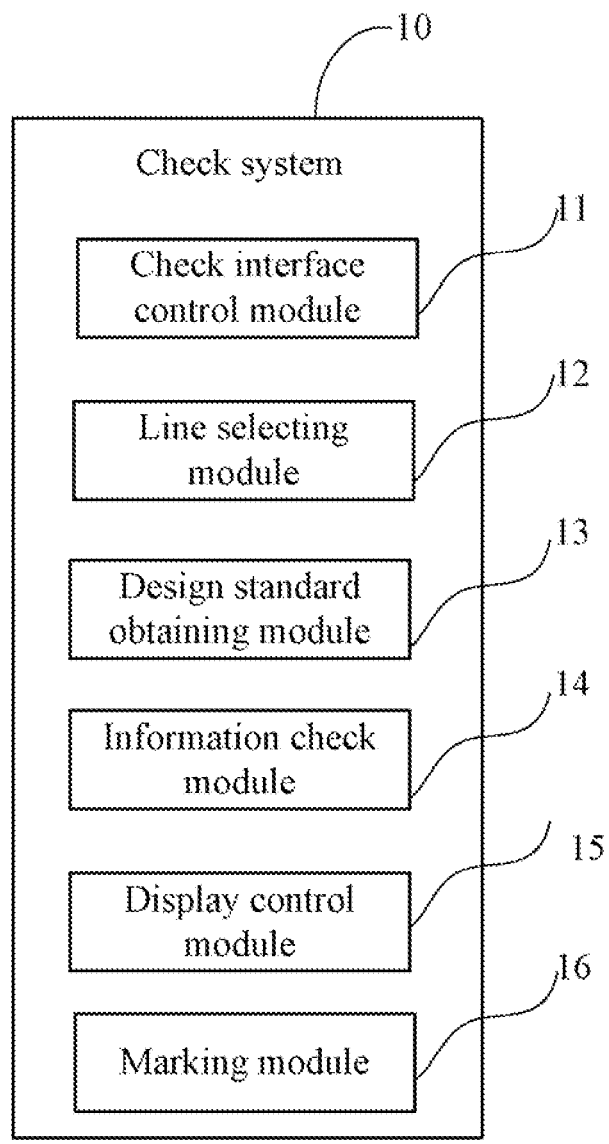
FIG. 2 is a block diagram of one embodiment of function modules of a check system in the computing device of FIG. 1.

FIG. 2 is a block diagram of the function modules of the check system 10 in the computing device 100 of FIG. 1. In one embodiment, the check system 10 includes a check interface control module 11, a line selecting module 12, a design standard obtaining module 13, an information check module 14, a display control module 15, and a marking module 16.

Figure 3:
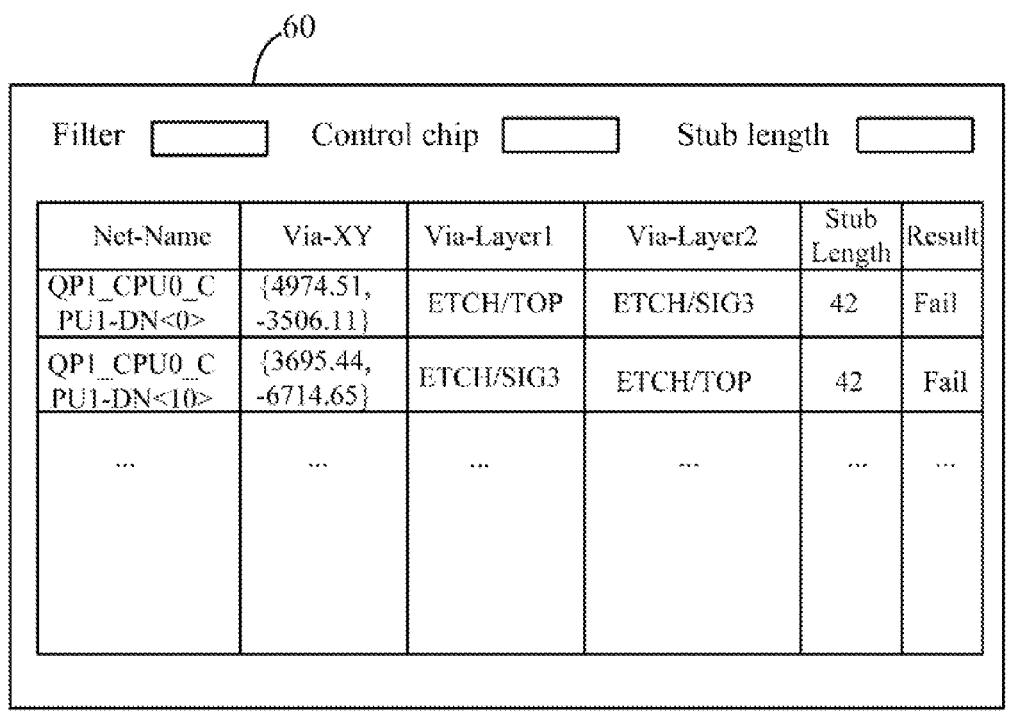
FIG. 3 is a schematic view of a check interface provided by the check system of FIG. 2.

The check interface control module 11 includes various software components and/or set of instructions, which may be implemented by the processor 20 to display a check interface 60 (see FIG. 3) on the display unit 40.

The line selecting module 12 includes various software components and/or set of instructions, which may be implemented by the processor 20 to select signal transmission lines from one currently run PCB layout 50 according to input through the check interface 60. In this embodiment, the line selecting module 12 is implemented by the processor 20 to determine a signal transmission line filter (not shown) and a control chip (not shown) input through the check interface 60, and select signal transmission lines from the PCB layout 50 according to the determined signal transmission line filter and the control chip.

The design standard obtaining module 13 includes various software components and/or set of instructions, which may be implemented by the processor 20 to receive the reference stub length input through the check interface 60.

The information check module 14 includes various software components and/or set of instructions, which may be implemented by the processor 20 to determine the actual stub length of each via stub of each via each selected signal transmission line connected to according to the information file corresponding to the currently run PCB layout 50, and determine whether the actual stub length of each via stub is less than or equal to the reference stub length. If the actual stub length of one via stub is less than or equal to the reference length, the information check module 14 is implemented by the processor 20 to determine the design of the one via stub satisfies the design standards. Otherwise, the information check module 14 is implemented by the processor 20 to determine the design of the one via stub does not satisfy the design standards, and determine the via the via stub of which is not designed to satisfy the design standards is a to-be-checked via.

The display control module 15 includes various software components and/or set of instructions, which may be implemented by the processor 20 to display the information of each to-be-checked via on the check interface 60. The information may include the coordinate information of each to-be-checked via, layers each to-be-checked via passing through, the actual stub length of the via stub of each to-be-checked via.

The marking module 15 includes various software components and/or set of instructions, which may be implemented by the processor 20 to mark each to-be-checked via whose information is selected through the check interface 60 in the currently displayed PCB layout, for example, highlight each selected to-be-checked via in the currently displayed PCB layout.

Figure 4:
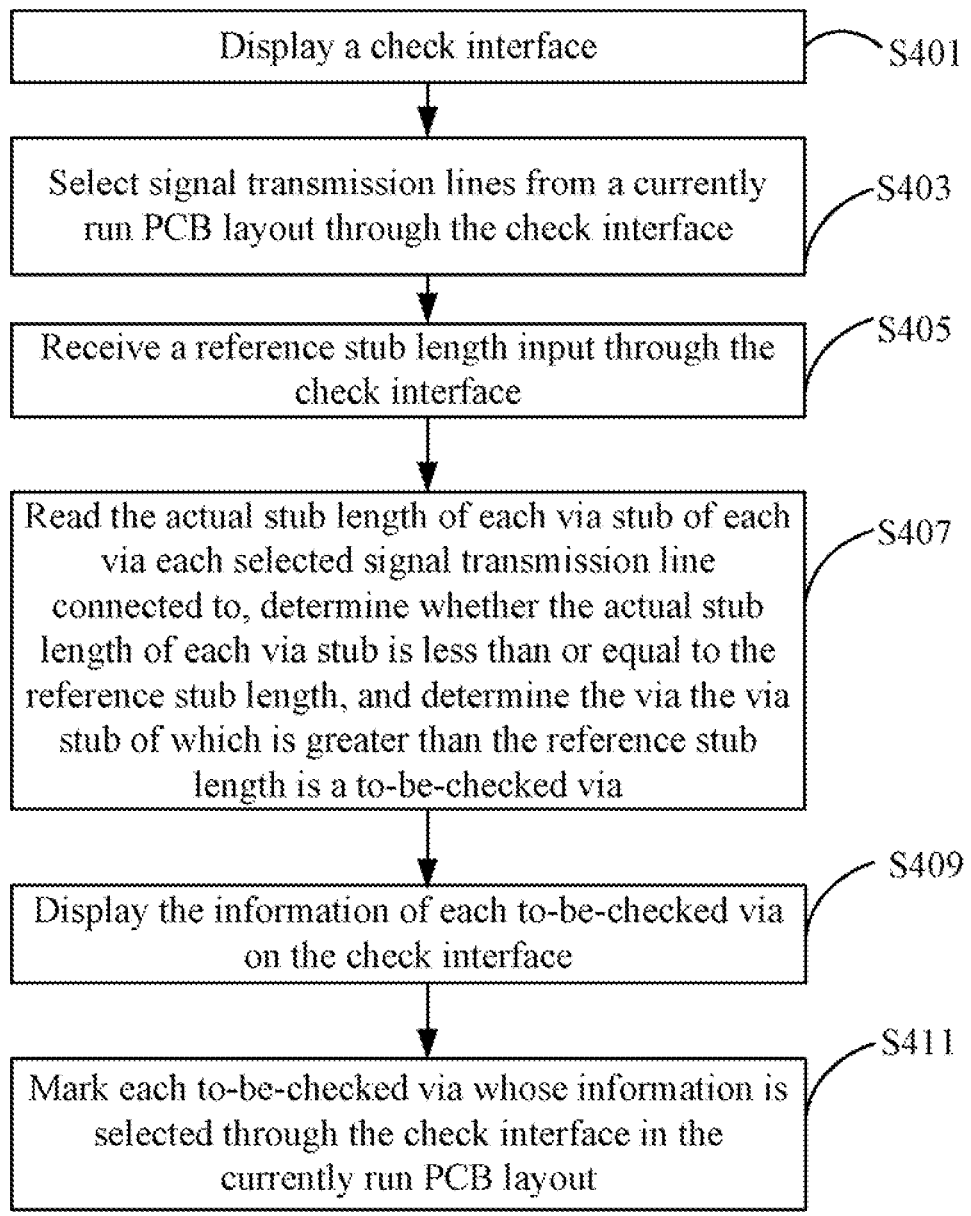
FIG. 4 is a flowchart of one embodiment of a method for checking the stub lengths of via stubs of a PCB layout.

FIG. 4 is a flowchart of one embodiment of a method for checking the stub lengths of via stubs of a PCB layout. Depending on the embodiment, additional blocks may be added, others removed, and the ordering of the blocks may be changed.

In block S401, the check interface control module 11 is implemented by the processor 20 to display the check interface 60 on the display unit 40.

In block S403, the line selecting module 12 is implemented by the processor 20 to select signal transmission lines from one currently run PCB layout 50 according to input through the check interface 60.

In block S405, the design standard obtaining module 123 is implemented by the processor 20 to receive the reference stub length input through the check interface 60.

In block S407, the information check module 124 is implemented by the processor 20 to determine the actual stub length of each via stub of each via each selected signal transmission line connected to according to the information file corresponding to the currently run PCB layout 50, and determine whether the actual stub length of each via stub is less than or equal to the reference stub length. If the actual stub length of one via stub is less than or equal to the reference length, the information check module 14 is implemented by the processor 20 to determine the design of the one via stub satisfies the design standards. Otherwise, the information check module 14 is implemented by the processor 20 to determine the design of the one via stub does not satisfy the design standards, and determine the via the via stub of which is not designed to satisfy the design standards is a to-be-checked via.

In block S409, the display control module 14 is implemented by the processor to display the information of each to-be-checked via on the check interface 60. The information may include the coordinate information of each to-be-checked via, layers each to-be-checked via passing through, and the actual stub length of the via stub of each to-be-checked via (see FIG. 3).

In block S411, the marking module 15 is implemented by the processor 20 to mark each to-be-checked via whose information is selected through the check interface 60 in the currently run PCB layout, for example, highlight each selected to-be-checked via in the currently run PCB layout. See FIG. 3, if the information of the to-be-checked via which coordinate is {4974.51, −3506.11} is selected, the marking module 15 is implemented by the processor 20 to highlight the via in the currently run PCB layout.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer-based method for checking stub lengths of via stubs of a printed circuit board (PCB) layout, the method comprising:
    displaying a check interface by using a computer;
    selecting signal transmission lines from a currently run PCB layout according to input through the check interface by using the computer;
    receiving a reference stub length input through the check interface by using the computer;
    determining the actual stub length of each via stub of each via each selected signal transmission line connected to according to an information file corresponding to the currently run PCB layout by using the computer; and
    determining that a design of one via stub satisfies the design standards by using the computer, if the actual stub length of the one stub via is less than or equal to the reference length, determining that a design of one via stub does not satisfy the design standards by using the computer, if the actual stub length of the one via stub is greater than the reference stub length, and determining that the via the via stub of which is not designed to satisfy the design standards is a to-be-checked via by using the computer.

2. The method as claimed in claim 1, further comprising:
    displaying the information of each to-be-checked via on the interface by using the computer.

3. The method as claimed in claim 2, wherein the information of each to-be-checked via comprises the coordinate information of each to-be-checked via, layers each to-be-checked via passing through, and the actual stub length of the via stub of each to-be-checked via.

4. The method as claimed in claim 2, further comprising:
    marking each to-be-checked via whose information is selected through the check interface in the currently run PCB layout by using the computer.

5. A computing device, comprising:
    a storage device;
    at least one processor; and
    a check system comprising computerized code in the form of one or more programs, which are stored in the storage device and executable by the at least one processor, the one or more programs comprising:
    a check interface control module operable to display a check interface;
    a line selecting module operable to select signal transmission lines from a currently run PCB layout according to input through the check interface;
    a design standard obtaining module operable to receive the reference stub length input through the check interface; and
    an information check module operable to determine the actual stub length of each via stub of each via each selected signal transmission line connected to according to an information file corresponding to the currently run PCB layout, determine that a design of one via stub satisfies the design standards, if the actual stub length of the one stub via is less than or equal to the reference length, determine that the design of one via stub does not satisfy the design standards if the actual stub length of the one via stub is greater than the reference stub length, and determine that the via the via stub of which is not designed to satisfy the design standards is a to-be-checked via.

6. The computing device as claimed in claim 5, wherein the one or more programs further comprise a display control module operable to display the information of each to-be-checked via on the check interface.

7. The computing device as claimed in claim 6, wherein he information of each to-be-checked via comprises the coordinate information of each to-be-checked via, layers each to-be-checked via passing through, and the actual stub length of the via stub of each to-be-checked via.

8. The computing device as claimed in claim 6, wherein the one or more programs further comprise a marking module operable to mark each to-be-checked via whose information is selected through the check interface in the currently run PCB layout.

* * * * *